United States Patent [19]
Leduc

[11] Patent Number: 5,455,450
[45] Date of Patent: Oct. 3, 1995

[54] SEMICONDUCTOR DEVICE COMPRISING A LATERAL BIPOLAR TRANSISTOR

[75] Inventor: Pierre Leduc, Colleville-Montgomery, France

[73] Assignee: U.S. Philips Corporation, New York, N.Y.

[21] Appl. No.: 223,621

[22] Filed: Apr. 6, 1994

[30] Foreign Application Priority Data

Apr. 7, 1993 [FR] France ................................ 93 04136

[51] Int. Cl.$^6$ ................................................ H01L 29/72
[52] U.S. Cl. ........................... 257/591; 257/590; 257/593
[58] Field of Search ................................ 257/593, 591, 257/590, 578, 583

[56] References Cited

U.S. PATENT DOCUMENTS

| | | | |
|---|---|---|---|
| 4,007,474 | 2/1977 | Yagi et al. | 357/34 |
| 4,951,108 | 8/1990 | Leduc | 257/591 |

FOREIGN PATENT DOCUMENTS 2029291 12/1988 France .

OTHER PUBLICATIONS

"The Physics and Modeling of Heavily Doped Emitters" Jesus A. Del Alamo et al (IEEE Transactions on Electron Devices, vol. ED–31, No. 12, Dec. 1984, pp. 1878–1888).

*Primary Examiner*—Sara W. Crane
*Assistant Examiner*—Nathan Kip Kelley
*Attorney, Agent, or Firm*—Steven R. Biren

[57] ABSTRACT

A bipolar lateral transistor, for example of the pnp type, is contained in a semiconductor device. The lateral transistor has a p-type emitter region and a p-type collector region laterally spaced apart by an n-type base region. This lateral transistor is formed in an n-type epitaxial layer at the surface of a p-type substrate. The transistor further has a $n^{++}$-type buried layer. The current gain in this lateral transistor is strongly increased by forming the emitter from a first partial emitter region which is weakly p-type doped and extends below an insulating layer, and a second partial emitter region which is strongly $P^{++}$-type doped and extends below the contact zone of the emitter, which is defined by an opening in the insulating layer. The respective thicknesses and doping levels of the first and second emitter regions are provided such that the first region is transparent to electrons and the second region forms a screen against electrons. In addition, the ratio of the surface areas of the two partial regions is higher than 2, and the area of the second region is chosen to be small. The various regions of the transistor are formed by very thin layers. Alternatively, the transistor may be of the npn type.

10 Claims, 3 Drawing Sheets

SEMICONDUCTOR DEVICE COMPRISING A LATERAL BIPOLAR TRANSISTOR

BACKGROUND OF THE INVENTION

The invention relates to a semiconductor device comprising a lateral transistor, which device comprises a semiconductor substrate of a first conductivity type having at its surface an epitaxial layer of a second conductivity type opposed to the first, in which layer an island is defined by insulating layers of a thickness which is at least equal to that of the said layer so as to form the said lateral transistor, which comprises:

- emitter and collector regions of the first conductivity type, laterally spaced apart by a region of the epitaxial layer which forms the base of the transistor,
- at least one electrical emitter contact zone for a metal contact pad for electrically contacting the emitter, delimited by an opening provided at the surface of the emitter region in an insulating layer which covers the surface of the device,
- a buried layer of the second conductivity type disposed at the level of the substrate-epitaxial layer junction, and in which lateral transistor in addition:
- the ratio of the surface area of the emitter region situated below the insulating layer, called first partial emitter region, to the area of the emitter region situated below said electrical emitter contact zone, called second partial emitter region, is at least equal to 2.

The invention finds its application in all integrated circuits comprising lateral bipolar transistors in which a high current gain is the object.

In the following description, the term "minority careers" is to be understood to mean electrons when the region in question is of the p-type and holes when the region in question is of the n-type.

A semiconductor device comprising a high-gain lateral transistor having the characteristics mentioned above is known from a prior-art document, i.e. the European Patent EP 032 2962. According to this cited document, the current gain of lateral transistors is limited on account of their structure.

The cited document thus recommends the realisation of the emitter region with a ratio between the surface areas of the region under oxide and the electrical contact region of between 20 and 200, which renders it possible to obtain a current of holes in preference to a current of electrons in the region under oxide, whereby the gain of the transistor is increased.

Surprisingly, the current gain of this transistor is even more increased when the emitter region has an elongate shape in a longitudinal direction, wherein the ratio of the major to the minor dimension of the emitter is at least equal to 5. The device disclosed in EP 032 2962 is capable of achieving a current gain of the order of 25 to 89 in this manner.

This device has the disadvantage that it is very bulky. In the present state of technology it is indeed mainly the object to increase considerably the integration density of active and passive elements on one and the same substrate. This condition is absolutely imperative in the semiconductor industry.

While the device known from the cited document does have an attractive gain performance, on the other hand its dimensions render it unsuitable for industrial development of circuits with a very high integration density.

Nevertheless, lateral transistors are important for realising integrated circuits in which the designer wants to include inverting transistors as well as current source transistors. In this case the inverting transistors are mostly realised as lateral transistors, while the current source transistors are vertical transistors.

It is well known to those skilled in the art that the current gain factors of lateral transistors are considerably lower than those of vertical transistors. The performance levels of the transistor disclosed in the Patent Application EP 032 2962 would therefore be highly attractive for compensating this gain difference, were it not for its dimensions.

Nevertheless, this device according to the prior art marks a turning point in the technology of bipolar lateral transistors because its operation is based on surface effects which were completely unknown in the state of the art obtaining until that moment, and corresponds to completely novel theories which are in complete contradiction to the theories on which the previously used state of the art was based.

To understand the novel theory applied in this Patent EP 032 2962, those skilled in the art may profitably read the publication with the title "The Physics and Modeling of Heavily Doped Emitters" by Jesus A. del Alamo and Richard M. Swanson in IEEE Transactions on Electron Devices, vol. ED-31, no. 12, December 1984, pp. 1878–1888. The term "heavily doped emitters" should be understood to cover, at the time of the publication, emitters more strongly doped than so-called LEC (Low Emitter Concentration) transistors, i.e. doped to approximately $10^{18}$–$10^{20}$cm$^{-3}$ for transistors with a thick emitter layer of between 2 and 10 µm. It is evident from this publication that the operation of strongly doped emitters of transistors having thick layers is governed by the transport and the recombination of the minority carriers, but that the mechanisms affecting the lifetime of the minority carriers in the silicon are extremely complex and should be the subject of extensive research. This publication also indicates that in many cases the experimental results are in contradiction to the model results. This results from the fact that, because of the complexity of the phenomena in question, the modelling cannot take into account all parameters. Only thorough research is capable of getting to the heart of the problem relating to the behaviour and the recombination time of the minority careers in the silicon in the emitters of the transistors.

Nevertheless, this publication establishes that this behaviour depends on the doping and the thickness of the emitter layer. The device described in the Application EP 032 2962 realises a selected number of means which utilize this teaching from the cited IEEE publication for providing the vertical bipolar transistor structure having an improved gain as described. With the appearance of the new theory which was put into practice in this Patent EP 032 2962, presenting an emitter with an area between 20 and 200 times larger than was usual in conventional devices and an extremely small contact zone, those skilled in the art were thus obliged seriously to reconsider all which had been the basis of their previous general knowledge, with all the difficulties mentioned in the IEEE publication.

Until that day, therefore, it had been particularly difficult to improve the device described in the Patent EP 032 2962, the more so since it was imperative for its industrial use in LSI (Large Scale Integration) circuits with a high integration density or VLSI (Very Large Scale Integration) circuits with a very high integration density to reduce its dimensions considerably while preserving the very valuable quality of a strongly increased gain.

It appears now that, far from helping those skilled in the art, new conditions imposed by the evolution of the technologies on the contrary have reinforced the difficulty of resolving this problem. These new conditions result from a recent technological breakthrough which consists in the realisation of layers, epitaxial and implanted, with thicknesses which are approximately 2 to 10 times smaller than those which obtained in the Patent Application EP 032 2962 cited above, which leads to thicknesses of the epitaxial layer for the base of the order of 1 μm, in which layer the emitter and collector regions are formed, also with small thicknesses. Owing to this evolution, it was found that the gain of the vertical transistors decreased as the thickness of the layers used was reduced. Thus the general insights of those skilled in the art were put into question again, and their experiences acquired in the understanding of the phenomena relating to transistor emitters had to be reconsidered on these new bases, because the old theories on transistors having thick layers were no longer directly applicable.

SUMMARY OF THE INVENTION

The technical problem, therefore, which is urgently to be solved now is how to realise a device with a lateral transistor which is compatible with the new technologies using very thin layers, which has a small surface area capable of integration on a large scale, and which provides an improved current gain compared with the prior art, a combination of conditions which seems to be particularly contradictory.

According to the invention, this technical problem is nevertheless resolved by means of a device whose elements are defined in the opening paragraph and which is in addition characterized in that:

- the epitaxial layer is of the so-called thin or ultrathin type, as are the regions realised in this epitaxial layer,
- the first partial emitter region has a first thickness h1 and a first level of conductivity of the first type obtained by a first doping level such that the diffusion length of the minority carriers injected vertically into this first partial region is greater than or equal to its thickness,
- the second partial emitter region has a second thickness h2 which is at least half the said first thickness h1 and a second conductivity level of the first type higher than the first level, this second level being obtained by a second doping level which is higher than the first doping level, while this second thickness and this second doping level are chosen such that this second partial region acts as a screen against the minority carriers,
- the first partial region completely surrounds the second partial region and, if applicable, the lower portion of the latter in the case in which h2<h1.

This semiconductor device provides the advantage that the current gain of the lateral transistor is very considerably increased and that the dimensions responsible for substrate area occupation are reduced. For example, the current gain may be of the order of 50 with a transistor having an emitter of approximately 10 times less surface area than the transistor known from EP 032 2962, or more than twice that gain with the same emitter surface area, all this in a thin-layer technology in accordance with the new objectives.

The effect produced by the new technical means applied to the emitter of the transistor is the more effective as the layers forming the transistor are thinner. Not only does this effect render it possible to compensate fully for the disadvantageous effect produced on the gain by the use of the thin layer technology, but the gain is even increased more strongly in proportion as the layers are thinner.

BRIEF DESCRIPTION OF THE DRAWING

The invention will be described below in detail with reference to the annexed diagrammatic Figures, in which.

DESCRIPTION OF THE PREFERRED EMBODIMENTS

Figure 1A:
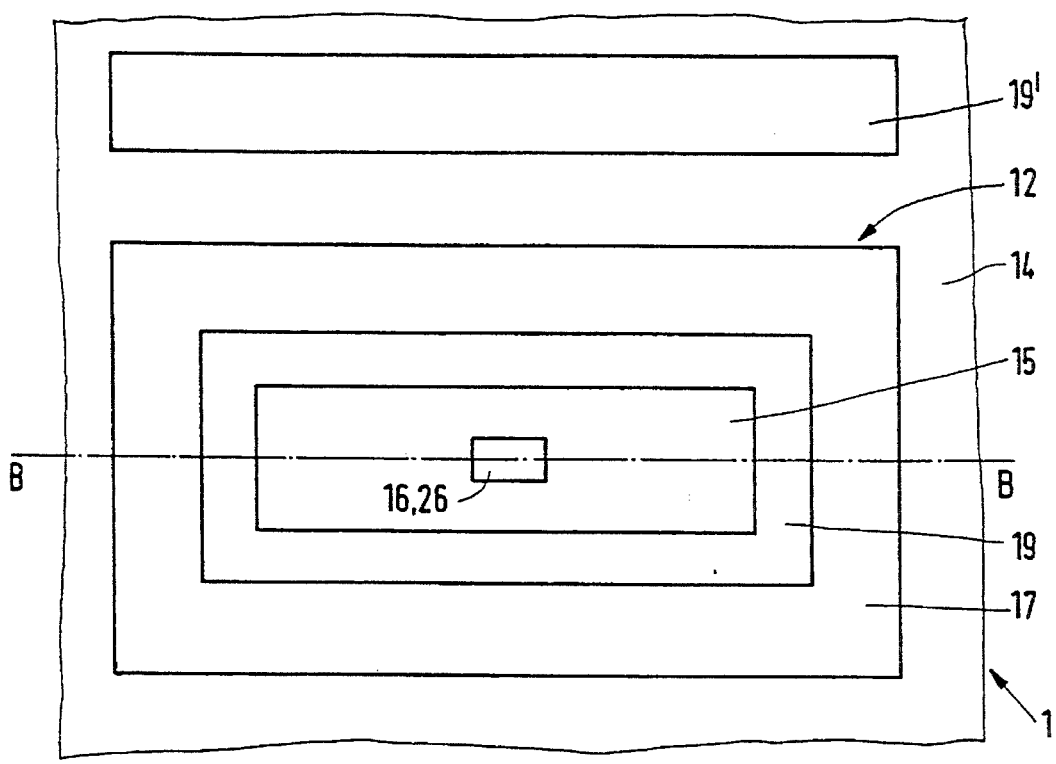
FIG. 1A shows in plan view a portion of a semiconductor device comprising a lateral bipolar transistor.
Figure 1B:
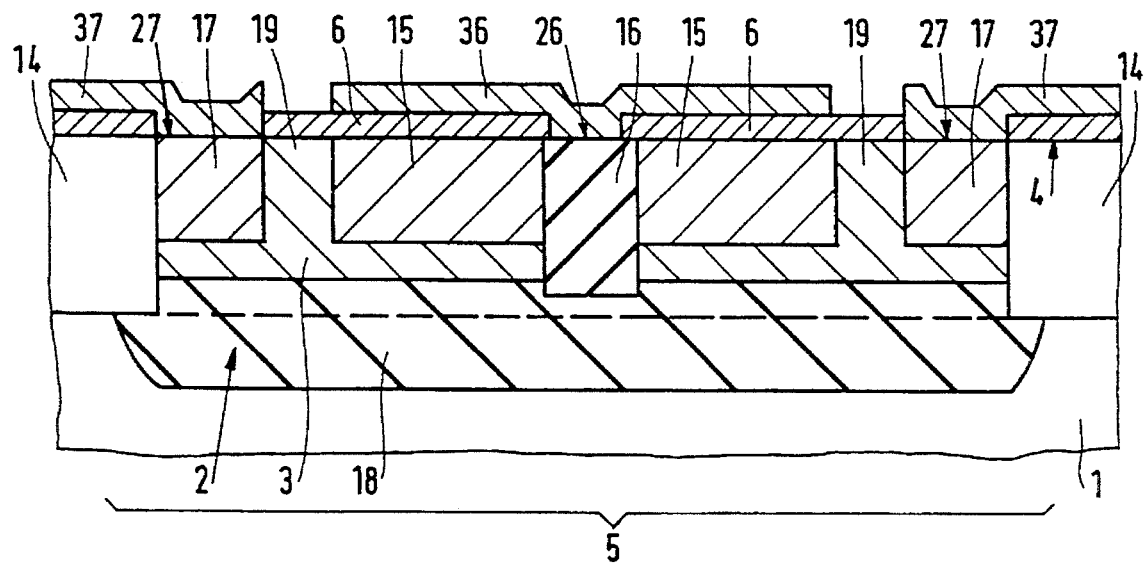
FIG. 1B is a cross-sectional view taken on the line B—B of the lateral bipolar transistor of FIG. 1A.

FIG. 1A is a diagrammatic plan view of a portion of an embodiment of a semiconductor device comprising a lateral bipolar pnp transistor according to the invention, and FIG. 1B shows a cross-section taken on the line B—B of this portion of the device.

According to this embodiment as shown in FIG. 1, the device comprises a semiconductor body 1, for example a substrate made of silicon (Si) of a first, p-conductivity type, to whose surface 2 is applied an epitaxial semiconductor layer 3 of the opposed, n-conductivity type. This n-type epitaxial layer is subdivided into several portions, among which at least one island 5 of the second, n-conductivity type situated between insulation regions 14, which insulation regions 14 extend throughout the thickness of the epitaxial layer 3 from the surface 4 of this layer down to the substrate 1.

The island 5 comprises a lateral bipolar transistor having an emitter region 15, 16 and a collector region 17 laterally separated from one another by a portion 19 of the epitaxial layer 3, which portion 19 forms the base of the lateral transistor. In this example, the lateral transistor is of the pnp type.

A buried layer 18 of the second conductivity type, so the n-type in the embodiment described, is disposed at the level of the junction between the substrate 1 and the epitaxial layer 3 within the boundaries of the island 5 formed by the insulation regions 14.

The electrical collector contact and emitter contact zones 27,26 are provided at the surface of the collector region 17 and of the emitter region 15,16, respectively.

Electrical contact zones 26,27 are defined by openings in an insulating layer 6 which covers the entire device. Metal contact pads 36,37 for the emitter and collector are provided over these respective openings, but they are in actual contact with the semiconductor material only within the respective openings 26,27.

The emitter region is formed by two partial emitter regions. The first partial emitter region 15 has a thickness h1, for example equal to the thickness of the collector region 17. An essential condition is imposed on the value of the thickness h1 and on the conductivity level, i.e. on the doping level of this first partial region 15: the thickness value h1 and the conductivity level must be such that the diffusion length of the minority carriers, in this case electrons, injected into this partial emitter region is greater than the said thickness h1. In other words, the first partial region 15 must be transparent to the injected minority carriers. This is achieved on the one hand by means of a small thickness h1 corresponding to an emitter region of the thin layer type which is fully compatible with the technology of lateral transistors. On the other hand, this is achieved by means of such a first partial emitter region which is in addition lightly doped, of the first conductivity type with a first low level, i.e. in the present case usually written by those skilled in the art as p or $p^+$.

Since the collector region 17 has the same small thickness h1 as the first partial emitter region 15, it can be realised in the same process step during the manufacture of the semiconductor device. In that case, the collector region is also of the first conductivity type at the first level p or $p^+$. The collector-base breakdown voltage is low owing to the small thickness of the collector region.

The emitter region in addition comprises a second partial emitter region 16 of a smaller surface area and with a thickness h2 which may have a value from half that of the first partial emitter region 15 to a value higher than that. Since the first partial emitter region 15 has a larger surface area than the second and is realised simultaneously with the collector region, the collector-emitter distance can be effectively controlled.

Preferably, the thickness h2 is such that the second partial emitter region extends from the surface 4 of the emitter region down to the buried layer 18, below the electrical emitter contact zone 26. This second partial emitter region, moreover, is of the first conductivity type with a second level of this conductivity type higher than the first level of the first partial region. Such a high level of the first conductivity type is written $p^{++}$ by those skilled in the art in the embodiment described.

Thus this strongly doped second partial emitter region extends below the metal emitter contact 36, particularly below the zone 26 where the latter is in actual contact with the emitter region.

If the second partial emitter region is a deep region, i.e. reaching down to the buried layer 18, it may be realised in the same step of the manufacturing process in which also the regions for electrically contacting the substrate are formed and which is a conventional step in the manufacture of integrated devices. The realisation thereof, accordingly, does not introduce an additional step into the process of making the semiconductor device.

The base region of the lateral transistor is formed by the epitaxial layer 3 in the island 5, of the second conductivity type, which layer is provided with a first level written n of this second conductivity type. The base region in addition comprises the buried layer 18 which is also of the second conductivity type but with a higher level of this second conductivity type, written $n^+$. Thus the buried layer 18 has a lower resistivity than the epitaxial layer 3. An aspect which is very favourable for the invention is that the epitaxial layer 3 is thin: typically less than 2 μm, and preferably less than 1 μm.

A surface base zone 19' of low ohmic value and of the second conductivity type $n^+$ is provided in the island 5 for accommodating a base contact at the surface of this region 19' in a contact zone defined by an opening in the insulating layer 6. The region 19' is insulated from other regions by an insulation region 12 similar to the regions 14.

The first partial emitter region will be called: peripheral region 15 hereinafter, and the second partial emitter region: central region 16.

It is important to note that the thicknesses h1 and h2 of the two emitter regions will always differ very little given the thicknesses which prevail in the new technologies.

Owing to the use of these small thicknesses, however, both the region 15 and the region 16, even if manufactured with the same thickness, will be very close to the buried layer 18. These regions 15 and 16 differ from one another first and foremost by their respective doping levels and surface areas.

Dimensions and doping levels will be given further below by way of non-limitative examples.

According to the invention, the electrical emitter contact zone 26 has substantially the same surface area as the second, central partial emitter region 16, which surface area is small compared with the area of the first, peripheral partial emitter region 15. The ratio of the area of the first, peripheral partial emitter region 15 to the area of the emitter contact zone 26 is greater than 2.

It is important to note that the emitter region cannot be constituted solely by the second, central partial emitter region 16. The combination of the two partial emitter regions 15,16 with the characteristics described above is essential for achieving the objects of the invention. Neither is it sufficient for the emitter to comprise a strongly doped second region surrounded by a first region which is only in very slight contact with the second region all around, or surrounded by the first region in one lateral direction only. The first, peripheral partial region with the lower doping level must surround the second, central partial region with the higher doping level completely in lateral direction with the area ratios given above, and possibly extend to below this second partial region if h2>h1.

Preferably, however, the second, heavily doped partial region may extend down to the buried layer 18 and thus favourably project beyond the less heavily doped first partial region in vertical direction.

An experimental study designed to verify certain theoretical hypotheses relating to the properties of carrier injection into the emitter have made it possible to arrive at a simplified injection model which is explained below with reference to FIG. 2.

Figure 2:
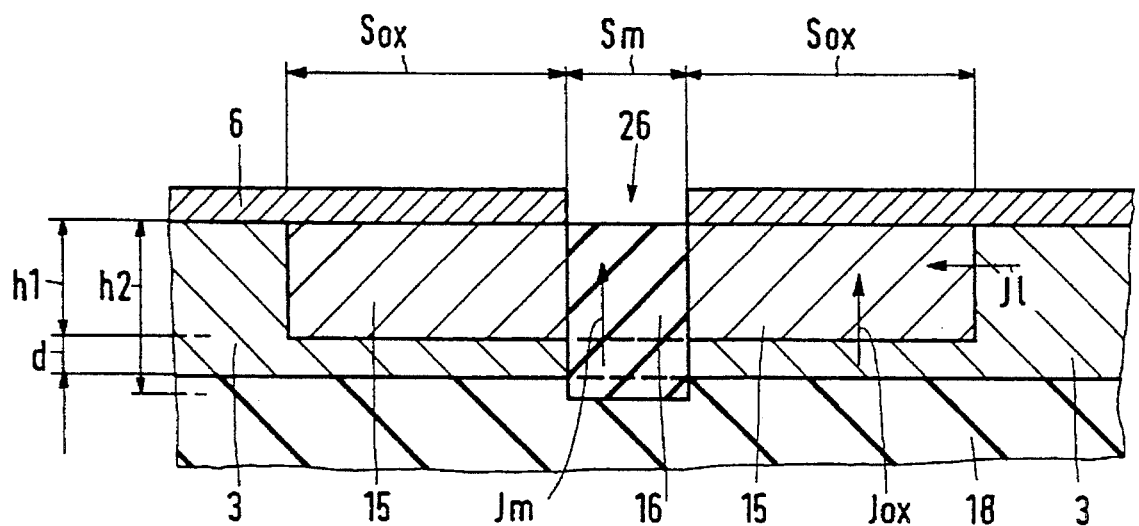
FIG. 2 is a symbolic representation of the current densities in the various portions of an emitter region, viewed in a diagrammatic cross-section of the emitter region of a lateral bipolar transistor.

FIG. 2 diagrammatically shows a p-type emitter region 15,16 realised in an n-type epitaxial layer 3 which forms the base layer. A protective insulating layer 6 is provided at the surface of this device and has an opening 26 for a metal emitter contact pad 36. The metal contact pad 36 is in actual contact with the emitter region 15,16 only within the opening 26 with a surface area Sm. The emitter region below the insulating layer, called first partial emitter region 15 or peripheral emitter region, has a surface area Sox. This area Sox comprises the entire area of the emitter region 15,16 with the exception of the area Sm below the emitter contact, i.e. the area of the central partial emitter region 16 or second partial emitter region corresponding to the area of the opening 26.

The peripheral emitter region 15 has a first thickness h1 and a doping level such that the diffusion length of the minority carders injected vertically therein is greater than or equal to the thickness of this region. The minority carriers in this p-type layer are electrons which travel from the buried layer towards the surface of the emitter region. The holes move in the opposite direction.

If the lateral transistor is of the npn type, instead of the pnp type as in the example described, then the minority carriers will be holes instead of electrons, but the operation of the transistor is subject to the same theoretical laws, and the word "electrons" may be simply replaced by "holes" in the theoretical discussion.

The lateral injection current density of the minority carriers into the base 3 is referenced Jl, the vertical injection current density of the minority carders below the emitter contact zone 16 is referenced Jm, and the vertical injection current density of the minority carriers below the portion of the oxide layer 6 which covers the peripheral emitter region 15 is referenced Jox. The injection current densities are indicated with arrows in FIG. 2.

The theory and experience have shown that the current gain $h_{FE}$ could be expressed in a first approximation as:

$$h_{FE}=(K.\ Jl.\ P1.\ h1)/(Jm.Sm.+Jox.Sox)$$

in which P1 is the perimeter of the peripheral emitter region 15, h1 is the thickness thereof, and K is a constant.

According to the invention, the current gain $h_{FE}$ is increased when the quantity Sm is small, when the quantity P1 is great, and by a further reduction of the term JmSm through reduction of the current density term Jm of the minority carriers.

This effect is obtained by the following means:

the choice of the area Sox of the peripheral emitter region 15 and of the area Sm of the emitter contact zone 26 so as to obtain a Sox/Sm ratio approximately equal to or greater than 2; and preferably equal to or greater than 5.

the existence of a second partial emitter region 16 having an area Sm substantially defined by the emitter contact zone 26 and having a thickness h2 at least half the thickness h1 of the first region and preferably such that this second region reaches down to the buried layer; and having a second conductivity level higher than the said first conductivity level of the peripheral partial region 15, which second level is written $p^{++}$ in the example described, obtained through a doping level at least twice that of the first emitter region. The thickness h2 and the doping level of the central emitter region are so chosen that this central region 16 acts as a screen against the minority carders.

The new value of the current density Jm below the contact, in the region 16, is smaller by a factor of approximately 3 than the current density value which is obtained when the region 16 is not doped more strongly than is the region 15.

The current gain is now substantially solely the result of the lateral injection.

This effect is optimized when the surface region of the emitter has an elongate shape in at least one longitudinal direction, the ratio between the major, longitudinal dimension and the minor, transverse dimension being favourably of the order of 5 or more.

In FIG. 1A, the elongate shape of the emitter in combination with an emitter contact zone of limited surface area renders it possible to profit fully from this phenomenon of injection below the insulating layer. According to the invention, with the realisation of the weakly doped peripheral emitter region 15 and of the strongly doped central emitter region 16 having a surface area limited to that of the contact zone 26, the roles played by these regions have been differentiated and the operation of the lateral transistor has been optimized.

The theory relating to the increase in gain in a transistor according to the invention takes into account simultaneously the recombination rate of the minority carriers and their diffusion length.

According to the invention, to increase the current gain of the transistor, the currents of holes are preferred and reinforced relative to the currents of electrons in the vertical direction. This option renders it possible to minimize the electron-hole recombination rate. This theory is in agreement with the theory of injection efficiency described in the cited IEEE publication.

The diffusion length of a minority carrier is defined as the mean distance travelled by a minority carrier in a given material before it recombines.

The recombination rate is defined as the number of recombinations which take place in a given volume per unit time. The recombination rate is a constant whose value depends on the geometry of the material, i.e. its thickness and its doping level.

Below the metal emitter contact in the lateral transistor known from the prior art, the recombination rate is very high when the emitter is weakly doped owing to the fact that the material is quasi-metallic and the electron current is always very strong. According to the invention, therefore, an emitter contact zone of very small area Sm is opted for so as to minimize the electron current; while at the same time a strongly doped partial region 16 is realised.

The recombination rate below the insulating layer is low. In addition, the doping level and thickness are so chosen that the diffusion length is greater than the thickness h1 of the peripheral emitter region. Thus the current of holes is promoted in this region by adopting a large area Sox. This result is obtained with a p-type doping which is comparatively weak and a thickness h1 which is small. This is one of the reasons why the technology using transistors with thin or ultrathin layers is favourable for the invention.

It follows from the theory based on the injection efficiency that in proportion as the central layer 16 is doped more strongly relative to the peripheral emitter layer 15, the current of holes is increased relative to the current of electrons. The result of this is that the central, strongly doped layer 16 is not a supplementary means for reducing the electron-hole recombinations, but that this strongly doped central layer 16 will cooperate with the weakly doped peripheral layer 15 in reinforcing the current of holes in relation to the current of electrons.

In fact, when the difference in doping level between the regions 15 and 16 is increased, an abrupt profile of impurities is created. A field which repels minority careers, here electrons, is created at the slope of the doping profile and the holes are favoured thereby.

Owing to the existence of the highly doped central region 16, it is also favourable that the layers are thin, i.e. that the distance d between the bottom of the strongly doped region 16 (see FIG. 2) and the top of the $n^+$ type layer 18 is very small. Nevertheless, in the present case of ultrathin layers, and in view of the dimensions present, the possibility of realising layers 15 and 16 with strongly differing thicknesses is dependent on available technical means, and it is in fact not disadvantageous for obtaining the envisaged gain improvement if said layers 15 and 16 should have the same thickness h1=h2. According to the invention, the use of structures with ultrathin layers is an advantage and not a disadvantage for the gain, because the mechanism of injection below the insulating layer is promoted.

In practice, the current gain is limited by the emitter resistance which, in the case of FIG. 1A, is dependent on the emitter length.

It is therefore necessary to choose the dimensions of the emitter contact zone such that a high gain is reconciled with an acceptable emitter resistance.

To obtain a lateral transistor having a high current, it is possible to realise a structure with several parallel emitter strips. Alternatively, a structure comprising a single emitter strip is interesting for operations at lower currents in which a high gain is preferred. Each emitter strip comprises a peripheral region 15 with at least one contact zone 26 at its centre and a second emitter region 16 extending below the contact zone 26. Each emitter strip may comprise several of these contact zones 26 spaced apart in the major direction of the emitter strip, with a second emitter region 16 extending below each contact zone 26. The various electrical contact zones 26 are then interconnected by the metallization 36 which forms the electrical contact pad of the emitter.

Figure 3:
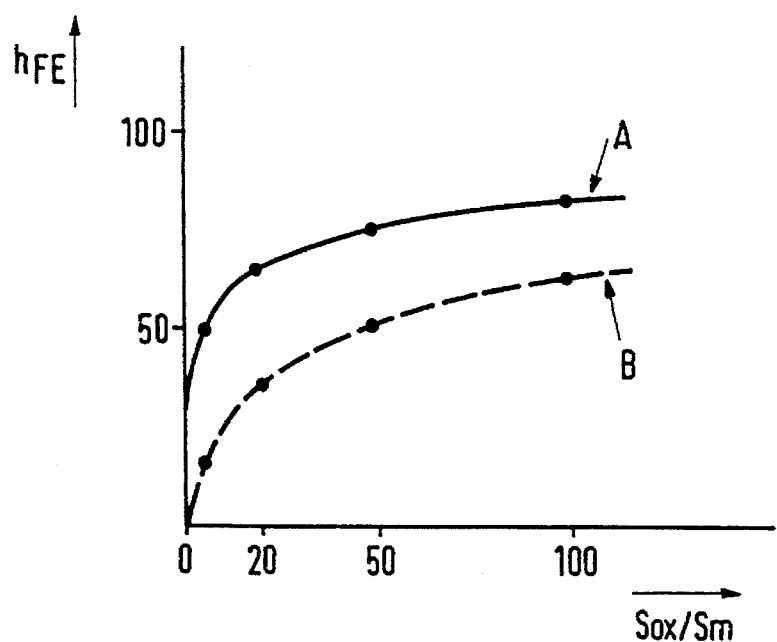
FIG. 3 shows comparative curves of the current gain $h_{FE}$ as a function of the ratio between the emitter areas below the insulating layer Sox and below the electrical contact zone Sm, Sox/Sm.

FIG. 3 shows the current gain curves $h_{FE}$ as a function of the respective Sox/Sm ratios. The gain $h_{FE}$ is defined as the ratio of the collector current to the base current IC/IB at a zero collector-base voltage. The curves have been drown for a base-substrate voltage of 3 V, while the transistors had the characteristics recommended in the manufacturing process described further below by way of example. The full curve A relates to a lateral transistor with a strongly doped $p^{++}$ central partial emitter region 16 differentiated from a less strongly doped peripheral emitter region 15. Broken-line curve B relates to a "comparison transistor" in which this weakly p-type doped region 16 is not differentiated from the region 15, i.e. having an emitter formed by a single uniform weakly p-doped region.

The gain in A is higher. This gain, moreover, is the higher in proportion as the Sox/Sm ratio increases.

A lateral transistor having a structure according to the invention has a gain $h_{FE}$ which tends towards a maximum of the order of 90.

As follows from a comparative study of the curves A and B in FIG. 3, the transistor according to the invention renders it possible to obtain the same gain as the comparison transistor under certain conditions. These conditions, however, are such that the transistor according to the invention requires an area Sox much smaller than that of the comparison transistor in order to obtain this gain. To obtain a gain $h_{FE}$ equal to 65 with the transistor according to the invention, for example, (Sox/Sm)=20, while for the comparison transistor this is (Sox/Sm)=100.

In other words, given the same milo, i.e. the same surface area, the transistor according to the invention has a much higher gain. Given a ratio (Sox/Sm)=5, for example, which corresponds to a small surface area occupation, the transistor according to the invention has a gain $h_{FE}$=50, whereas the comparison transistor reaches no more than 15.

Similarly, with an area ratio (Sox/SM) equal to no more than 2 in the transistor according to the invention, the gain of 35 to 40 is already obtained, while the comparison transistor has substantially no gain at all with these dimensions.

This is achieved, moreover, without any secondary adverse effect on the breakdown voltage.

The transistor according to the invention thus represents a considerable step forward compared with the prior art.

The transistor described is of the lateral pnp type, but it may equally well be of the npn type having any npn structure generally known to those skilled in the art. In such a lateral npn transistor, the two partial emitter regions are of the n-type with medium conductivity levels for the peripheral region and high levels for the central region, as described above. The area ratio Sox/Sm is again the same.

A description will be given below, by way of non-limitative example, of a manufacturing process for the device shown in FIGS. 1A and 1B.

An implantation of suitable impurities for producing an n-type conductivity for the formation in a later stage of the $n^+$-type buried layer 18 through diffusion is realised in a portion of a surface 2 of a p-type silicon substrate 1 of approximately 120 μm thickness, having a doping level of approximately $5\times10^{15}$ cm$^{-3}$ and a resistivity of approximately 3 Ω.cm. Then an epitaxial n-type silicon layer 3 is realised in usual manner with a thickness which may be smaller than 1 μm, or may alternatively be up to 2 μm, with a doping level of approximately $2\times10^{16}$ cm$^{-3}$ and a resistivity of the order of 0.3 Ω.cm. An epitaxial layer having a thickness lying in this range is considered thin or ultrathin by those skilled in the art. At this stage the diffusion of the n-type impurity for forming the buried layer 18 is carried out to a thickness of the order of 1 μm and with a doping level of the $n^+$-type of approximately $2\times10^{19}$ cm$^{-3}$.

The epitaxial layer 3 may be made n-type through doping with arsenic (As). The epitaxial layer 3 forms the base region. The epitaxial layer had a thickness of 1.25 μm in the transistor for which the gain curves are given in FIG. 3.

The separating zones 12, 14 may be realised by means of insulating islands of silicon oxide $SiO_2$ (deep oxide).

The peripheral partial emitter region 15 may be realised at the centre of the base region through implantation and subsequent diffusion of an impurity such as boron (B) for obtaining p-type conductivity through a mask having an opening of large surface area. In the example described, the maximum doping level is of the order of $5\times10^{18}$ cm$^{-3}$, the thickness h1 of the order of 0.7 μm, and the square resistance of the order of 500Ω. With these values, the first partial emitter region is transparent to the minority carriers.

The second, central partial emitter region 16 may then be realised through implantation and subsequent diffusion of an impurity such as boron (B) for obtaining the $p^{++}$ conductivity through a mask with a smaller opening, with a doping level higher than that of the first diffusion, the maximum doping level in this case being $10^{19}$ cm$^{-3}$; and to a thickness h2 which in this example is greater than the thickness h1 of the peripheral region and which reaches down to the buffed layer 18. For example, h2=1 μm. In alternative embodiments, however, it is possible to give h2 a lower value, for example h2=0.4 μm, while all other thicknesses remain unchanged. The gain results, however, are better when h2>h1. The square resistance in this example is of the order of 120Ω. With these values, the second partial emitter region 16 forms a screen against the minority carriers.

Generally, the thickness h2 of the central emitter region lies in a range between half the value of h1 and a value slightly higher than h1. In view of the thickness chosen for the epitaxial layer 3, the thicknesses h1 and h2 are also considered as being thin or ultrathin.

The ratio between the doping of the central emitter region and the doping of the peripheral region lies in a range of approximately 2 to 10, while the doping of the peripheral region 15 is related to the thickness h1 in that the diffusion length of the minority carriers should be greater than h1, while the doping of the central region is chosen so as to form the desired screen against these minority carriers in cooperation with the thickness h2.

A protective layer 6, for example made of silicon oxide (SiO$_2$) or of silicon nitride (Si$_3$N$_4$), is realised at the surface of the entire device, with openings in the surface at the zones designed for the contacts. The area of the opening Sm and of the corresponding region 16 is chosen as small as the technology will allow. The improvements brought about by the invention and caused by the doping of the central region 16, however, have the result that this condition imposed on Sm is not as constraining as in the prior art.

Since the area Sm is small, the transistor according to the invention does not occupy much space and is compatible with integration on a large scale.

In FIGS. 1 and 2, the dimensions of the various parts are not true to scale in order to be clearly visible.

If the thickness of the epitaxial layer 3 is reduced to approximately 1 μm, those skilled in the art will preferably keep the thickness h1 of the peripheral emitter region 15 constant at approximately 0.7 μm. The distance d will be reduced thereby, which is favourable for the invention.

In alternative embodiments, those skilled in the art may realise the peripheral region 15 and the central region 16 or emitter contact 26 with patterns already described in prior-art document EP 032 2962 while maintaining the conditions as prescribed in the present document.

Figure 4A:
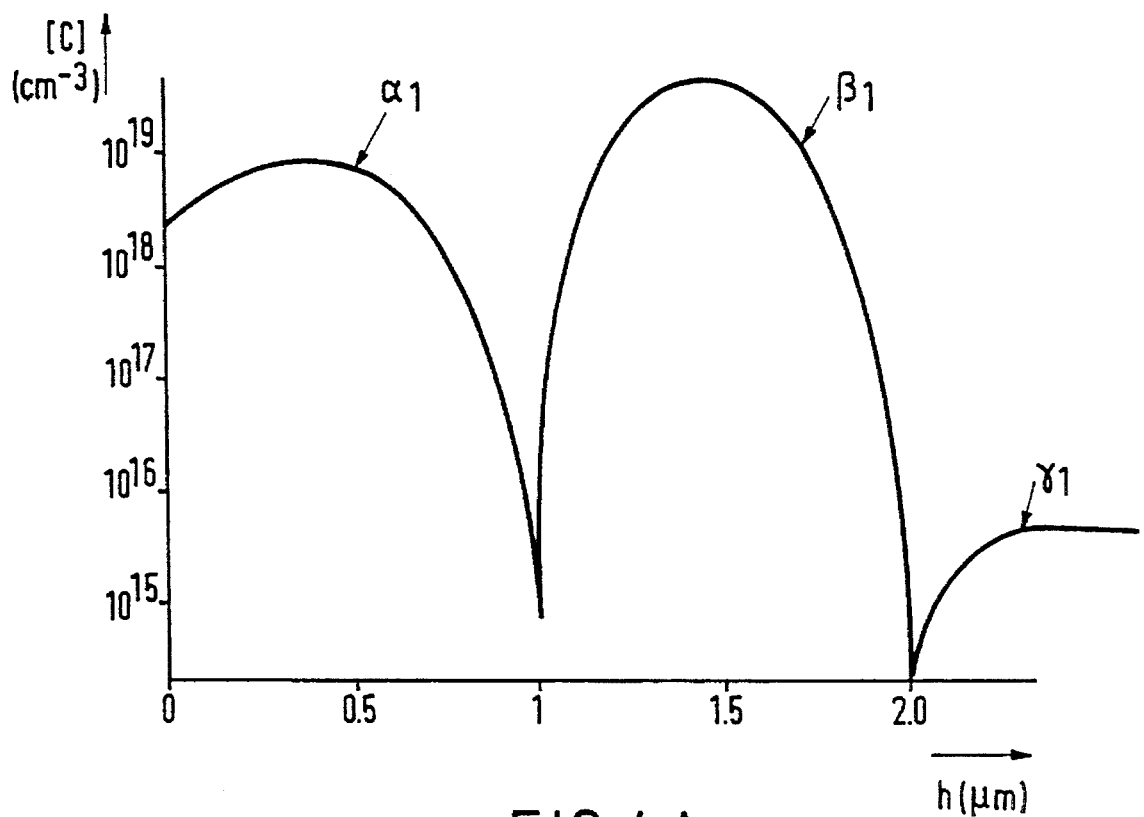
FIGS. 4A and 4B show curves depicting doping levels [C] as a function of the depth h, starting from the surface of the emitter region, below the insulating layer in FIG. 4A and below the electrical contact zone in FIG. 4B.
Figure 4B:
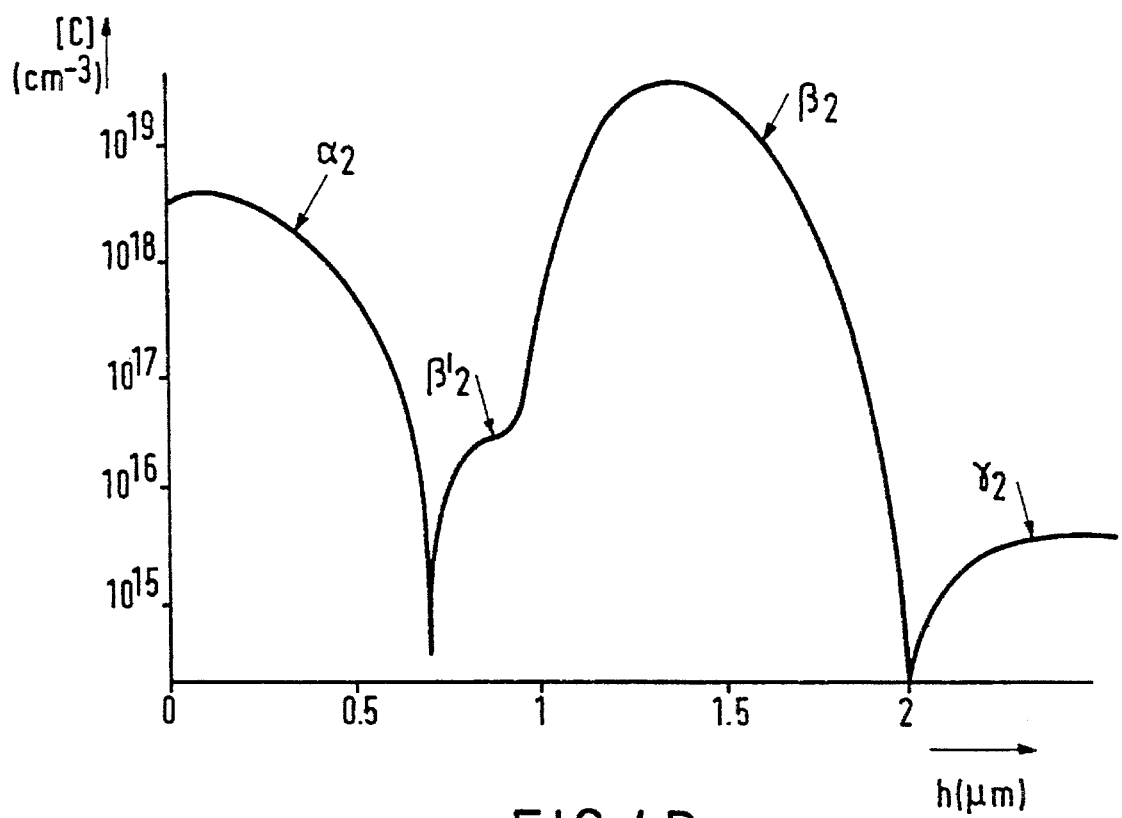

FIGS. 4A and 4B show the doping profiles of the various regions starting from the surface 4 of the lateral transistor towards the substrate 1 according to the manufacturing process described above.

FIG. 4A shows the doping level [C] as the number of impurities per cm$^3$ on the ordinate as a function of the depth h in μm on the abscissa in vertical cross-section through the central region 16 of the emitter below metal (contact zone 26).

The portion α2 corresponds to the p$^{++}$-type doping (10$^{19}$ cm$^{-3}$) in the central emitter region 16 below metal extending over a thickness of 1 μm, the portion β1 corresponds to the n$^+$ doping level of the buried layer 18 of the base situated between 1 and 2 μm below the emitter, and the portion γ1 corresponds to the p-type doping level of the substrate (5×10$^{15}$ cm$^{-3}$).

FIG. 4B shows the doping level [C] as the number of impurities per cm$^3$ on the ordinate as a function of the depth h in μm of the abscissa in vertical cross-section through the peripheral emitter region 15 below oxide (insulating layer 6).

The portion α2 corresponds to the p-type doping level (5×10$^{18}$ cm$^{-3}$) in the emitter region 15 extending directly below the oxide over a thickness of 0.7 μm; the portion β2 corresponds to the doping level of the portion of the epitaxial layer 3 lying between the emitter region 15 and the buried layer 18; the portion β2 corresponds to the doping level of the n$^+$-type of the buried layer 18 lying between 1 and 2 μm, and the portion γ2 corresponds to the doping level of the p-type substrate (5×10$^{15}$ cm$^{-3}$).

These curves have been drawn for a thickness of the epitaxial layer 3 of 1.25 μm.

I claim:

1. A semiconductor device comprising:
    a substrate of a first conductivity type;
    an epitaxial layer of a second conductivity type, opposite to the first conductivity type, on said substrate and forming a substrate-epitaxial layer junction therewith;
    an island defined in said epitaxial layer by insulating regions extending at least to the substrate-epitaxial layer junction;
    a lateral transistor formed in said island, comprising:
        emitter and collector regions of the first conductivity type extending from the top surface of the epitaxial layer, and laterally spaced by a base region which is formed by a part of the epitaxial layer, said emitter region comprising:
            a first partial emitter region having a first thickness and a first doping concentration such that the diffusion length of minority carriers injected vertically into said first partial emitter region is at least equal to the first thickness, said first partial emitter region having a first top surface area; and
            a second partial emitter region completely surrounded by the first partial emitter region, said second partial emitter region having a second thickness which is more than half the first thickness and a second doping concentration which is higher than the first doping concentration, such that the second partial emitter region acts as a screen against minority carriers, said second partial emitter region having a second top surface area, which is at most half of the first top surface area;
        a buried layer of the second conductivity type disposed in said device at the level of the substrate-epitaxial layer junction;
        an insulating layer covering said epitaxial layer;
        an electrical emitter contact zone for contacting the second partial emitter region, said contact zone being formed by an opening in the insulating layer at the surface of the second partial emitter region, said contact zone having a third surface area substantially equal to the second top surface area; and
        a metal contact pad contacting the second partial emitter region at said electrical emitter contact zone; and
    wherein the epitaxial layer and the regions realized in said epitaxial layer are less than about 2 microns thick.

2. A device as claimed in claim 1, wherein the second thickness is smaller than the first thickness, and the second partial emitter region is embedded in the first partial emitter region.

3. A device as claimed in claim 1, wherein the second thickness is such that the second partial emitter region extends into the buried layer.

4. A device as claimed in claim 1, wherein the ratio of the first top surface area to the second top surface area is less than 100.

5. A device as claimed in claim 1, wherein the ratio of the first top surface area to the second top surface area is less than 10.

6. A device as claimed in claim 1, wherein the emitter region is formed by an elongated strip, said elongated strip comprising at least one said second partial emitter region, each said second partial emitter region being contacted by said metal contact pad.

7. A device as claimed in claim 6, wherein the elongated strip comprises a plurality of said second partial emitter regions spaced apart over the longitudinal direction of said elongated strip, each of said second partial emitter regions being contacted by said metal contact pad.

8. A device as claimed in claim 1, wherein the emitter region is formed by a plurality of elongated strips, the ratio of a longitudinal direction to a transverse direction of each elongated strip being at least equal to 5, each elongated strip in said plurality of elongated strips comprising said first partial emitter region and at least one said second partial emitter region, each said second partial emitter region being contacted by said metal contact pad.

9. A device as claimed in claim 8, wherein each of said elongated strips comprises a plurality of said second partial emitter regions spaced apart in the longitudinal direction of each of said elongated strips, each said second partial emitter region being contacted by said metal contact pad.

10. A device as claimed in claim 1, wherein the ratio of the first doping concentration to the second doping concentration is at least equal to 2.

* * * * *